(12) United States Patent
Kobayashi et al.

(10) Patent No.: US 7,171,665 B1
(45) Date of Patent: Jan. 30, 2007

(54) DISPLAY AND ACQUISITION OF DATA, EXCHANGED BY INTERPROCESS, FOR THE PHYSICAL PROPERTIES OF A SOLAR BATTERY

(75) Inventors: Takuma Kobayashi, Kyotanabe (JP); Naoki Manabe, Kyoto-fu (JP); Nobuyoshi Takehara, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 563 days.

(21) Appl. No.: 09/651,294

(22) Filed: Aug. 30, 2000

(30) Foreign Application Priority Data

Sep. 2, 1999 (JP) .................................. 11-249208

(51) Int. Cl.
G06F 9/46 (2006.01)
G06F 15/16 (2006.01)

(52) U.S. Cl. ...................................... 718/103; 709/217
(58) Field of Classification Search ................ 709/201, 709/102, 103, 106; 718/103
See application file for complete search history.

(56) References Cited

U.S. PATENT DOCUMENTS

| 4,222,665 | A | * | 9/1980 | Tachizawa et al. ......... 356/218 |
| 5,379,237 | A |   | 1/1995 | Morgan et al. |
| 5,438,329 | A | * | 8/1995 | Gastouniotis et al. .. 340/870.02 |
| 5,530,373 | A |   | 6/1996 | Gibson et al. ............... 324/758 |
| 5,630,128 | A | * | 5/1997 | Farrell et al. ................ 718/103 |
| 5,825,302 | A | * | 10/1998 | Stafford ................. 340/870.01 |
| 6,112,224 | A | * | 8/2000 | Peifer et al. ................. 709/202 |
| 6,169,414 | B1 | * | 1/2001 | Yoshino et al. ............. 324/767 |
| 6,370,569 | B1 | * | 4/2002 | Austin ......................... 709/217 |
| 6,539,422 | B1 | * | 3/2003 | Hunt et al. .................. 709/217 |

FOREIGN PATENT DOCUMENTS

| JP | 02-280235 | 11/1990 |
| JP | 04-033105 | 2/1992 |
| JP | 05-502301 | 4/1993 |
| JP | 5-151304 | 6/1993 |
| JP | 6-59710 | 3/1994 |
| JP | 06-168145 | 6/1994 |
| JP | 8-240640 | 9/1996 |
| JP | 10-51711 | 2/1998 |
| JP | 11-226222 | 8/1999 |
| WO | 91/19164 | 12/1991 |

* cited by examiner

Primary Examiner—John Follansbee
Assistant Examiner—Ashok Patel
(74) Attorney, Agent, or Firm—Fitzpatrick, Cella, Harper & Scinto

(57) ABSTRACT

When a measuring system for a solar battery is operated and controlled by one execution program, the execution program is roughly divided into a program portion corresponding to measurement of a sunshine time in one day and a program portion corresponding to measurement for several to about 20 years. In this case, even a small error in part of the program may stop the entire measuring system. To prevent this, the program is divided into an execution program for acquiring data, an execution program for generating information to be displayed, on the basis of the acquired data, and an execution program for recording the acquired data in a recording medium. Interprocess communication is used to exchange data between the execution programs.

1 Claim, 11 Drawing Sheets

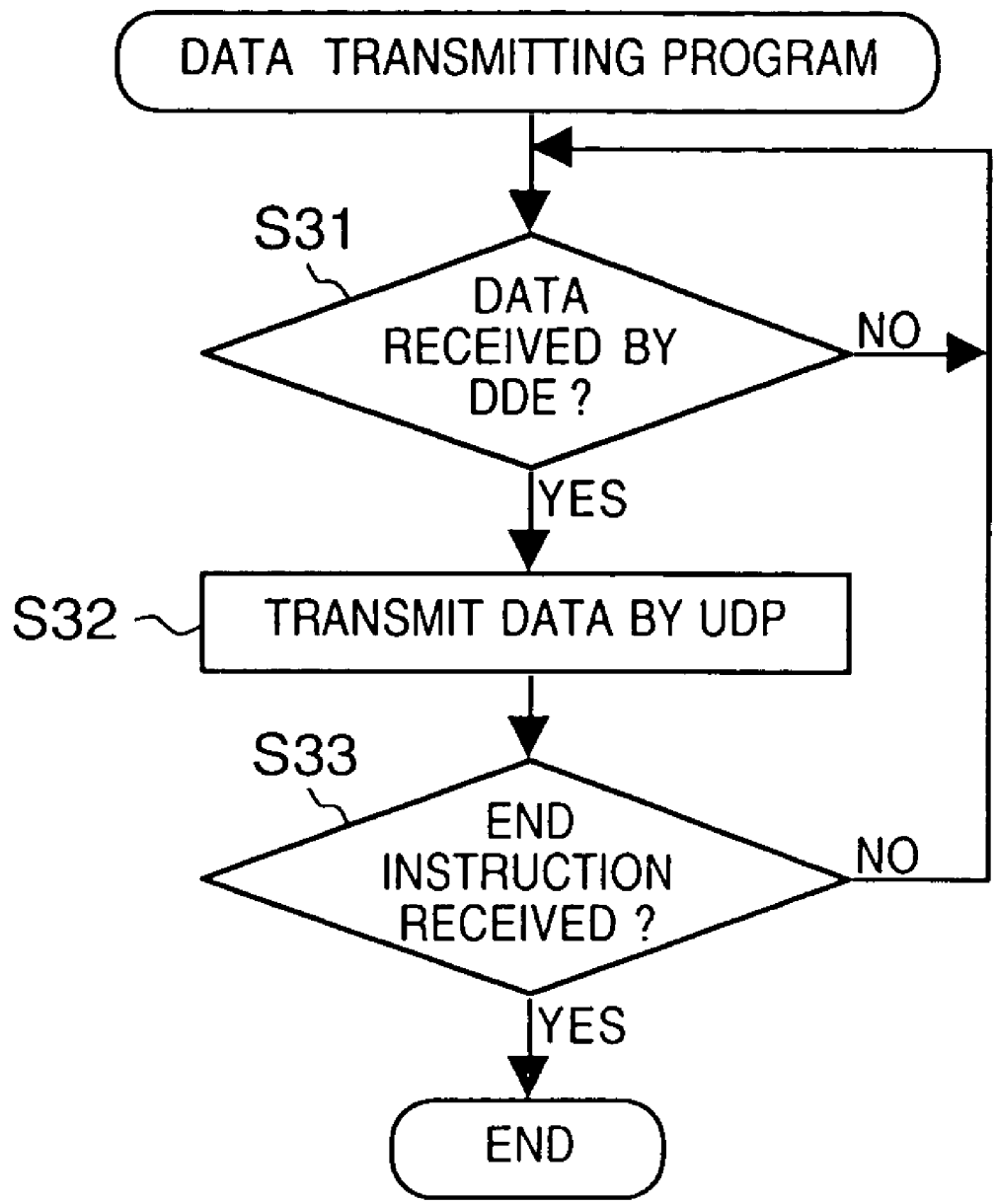

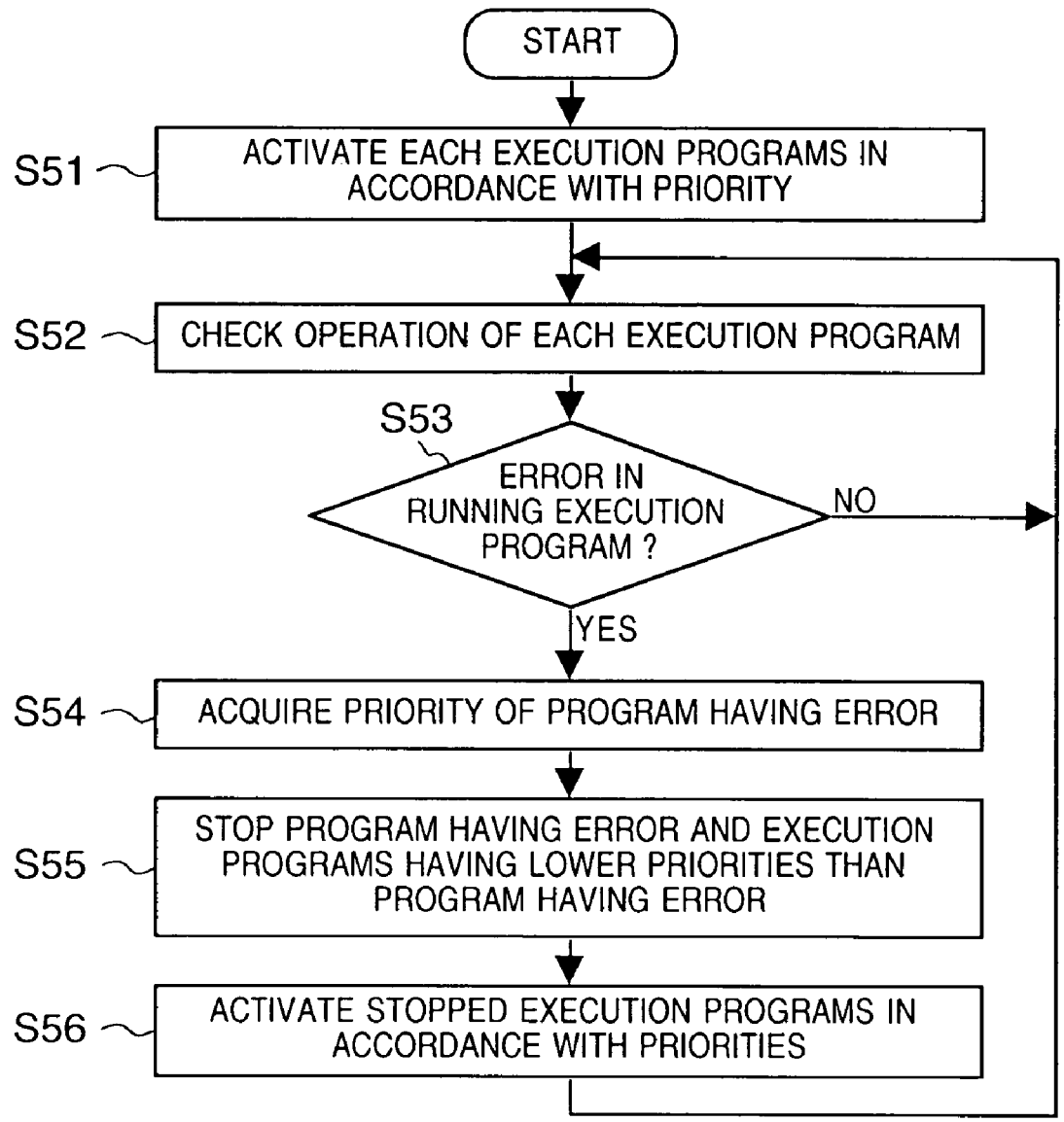

DISPLAY AND ACQUISITION OF DATA, EXCHANGED BY INTERPROCESS, FOR THE PHYSICAL PROPERTIES OF A SOLAR BATTERY

FIELD OF THE INVENTION

The present invention relates to an information processing apparatus and method and, more particularly, to an information processing apparatus and method used for a measuring system for acquiring measurement target data.

BACKGROUND OF THE INVENTION

In recent years, the processing ability of personal computers greatly improves, various kinds of application software for spreadsheets, databases, and graph processing become available, and the environment for program development is being completed. Under these circumstances, not stand-alone measuring instruments having advanced control functions and data analysis functions but measuring systems for controlling various measuring devices, mainly including commercially available personal computers, to execute advanced data analysis are becoming the mainstream of data measuring systems.

As a basic form of such a measuring system, data detected by a detector including various sensors and signal converters is acquired by a data acquisition apparatus connected to a personal computer through a communication line, transferred to the personal computer, and analyzed.

In the measuring system, functions of operating and controlling it, including a function of acquiring data, a function of recording acquired data in a file, and a function of displaying acquired data on a display unit such as a monitor, are normally contained in one execution program. Hence, in many cases, the entire measuring system is controlled by this program.

However, executing and operating the measuring system in accordance with one execution program poses the following problems.

Since the measuring system is controlled by one execution program, even a small bug in a function may stop the entire measuring system.

In addition, since various functions are contained in one execution program, debug in generating the program is difficult. Furthermore, when the system configuration is to be modified or extended, or when measuring systems having different display methods on display units or different numbers of personal computers connected are to be installed at a plurality of sites, the programs must be individually modified in units of systems.

As a characteristic feature, a recent personal computer can simultaneously execute a plurality of application programs under multi-task control because of great progress in OS (Operating System), and the entire system need not be operated and controlled by one execution program. However, even when the entire system is operated and controlled by a plurality of execution programs, there is no guideline to discriminate the functions of execution programs from each other, so it is hard to appropriately discriminate the functions from each other.

For example, assume that a measuring system for a solar battery is operated and controlled by one execution program. This execution program is roughly divided into a program portion corresponding to measurement for a long time (sunshine time in a day) and a program portion corresponding to measurement for a long period (several to about 20 years). As a result, even a small error in part of the program may stop the entire measuring system.

SUMMARY OF THE INVENTION

The present invention has been made to solve the above problems, and has as its object to provide an information processing apparatus and method capable of stably acquiring measurement target data.

In order to achieve the above object, according to a preferred aspect of the present invention, there is provided an information processing apparatus for accumulating measurement target data, the apparatus comprising: acquisition means for acquiring the data; and display means for generating information to be displayed, on the basis of the acquired data, wherein the acquisition means and the display means exchange data by interprocess communication.

There is also provided an information processing method of accumulating measurement target data, the method comprising the steps of: acquiring the data; and generating information to be displayed, on the basis of the acquired data supplied by interprocess communication.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 6A is a flow chart for explaining the operation of a data transmitting program shown in FIG. 5;

FIG. 8 is a flow chart showing the operation of a management program shown in FIG. 7.

DETAILED DESCRIPTION OF THE PREFERRED EMBODIMENTS

A measuring apparatus according to an embodiment of the present invention will be described below in detail with reference to the accompanying drawings. A solar battery data measuring system for measuring the power generation characteristic of a solar battery panel will be described below. However, any other data can be measured as far as information to be measured can be acquired by a personal computer through various detectors as numerical data.

FIRST EMBODIMENT

Arrangement

Figure 1:
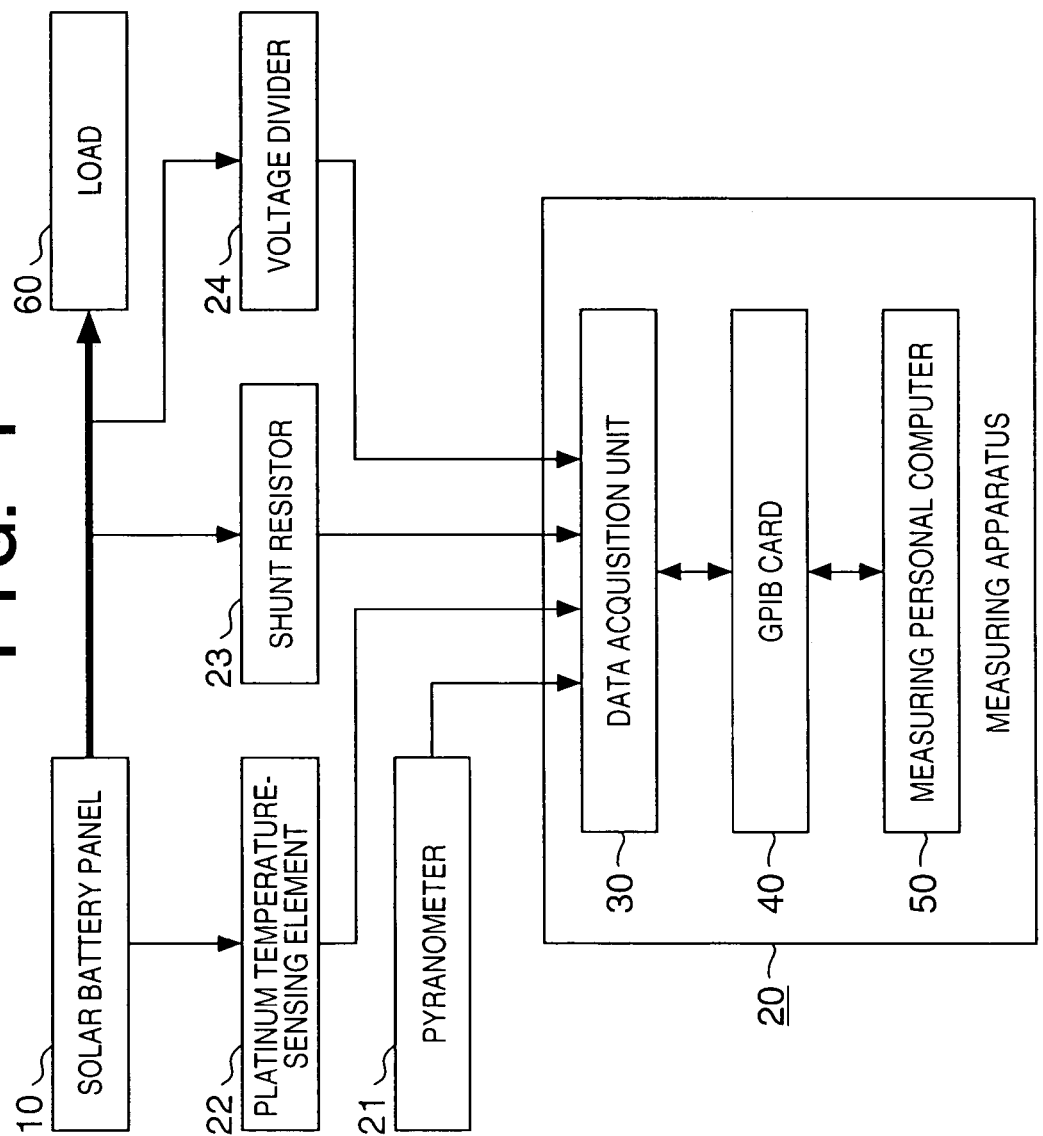
FIG. 1 is a block diagram showing the arrangement of a measuring system according to the first embodiment.

FIG. 1 is a block diagram showing the arrangement of a measuring system including a measuring apparatus 20 of the first embodiment.

The output voltage, current, temperature, and the like of a solar battery panel 10 serving as a measurement target are converted into voltage signals corresponding to the detection values by detection means such as a voltage divider 24, shunt resistor 23, and platinum temperature-sensing element (PT100) 22 and acquired by a data acquisition unit 30. The acquired data are acquired by a measuring personal computer 50 through a connection cable and general-purpose interface such as GPIB at an interval set on a program running on the measuring personal computer 50.

The solar battery panel 10 comprises an amorphous silicon solar battery panel available from CANON INC. and is controlled by an electronic load 60 such that the output from the solar battery panel 10 is always maximized. The method of controlling the load 60 is not an essential part of this embodiment, and a detailed description thereof will be omitted.

The power generation characteristic of the solar battery panel 10 is measured using the shunt resistor 23 for detecting the output current from the solar battery panel 10, the voltage divider 24 for detecting the output voltage, a pyranometer 21 for detecting the illumination energy received by the solar battery panel 10, and the platinum temperature-sensing element 22 for detecting the temperature of the solar battery panel 10. The outputs from these detectors are connected to the corresponding measurement channels of the data acquisition unit (data acquisition unit DA100 available from YOKOGAWA ELECTRIC CORP.) 30. The data acquired by the data acquisition unit 30 are sent to a GPIB card 40 attached to the measuring personal computer 50 through a GPIB cable.

Figure 2:
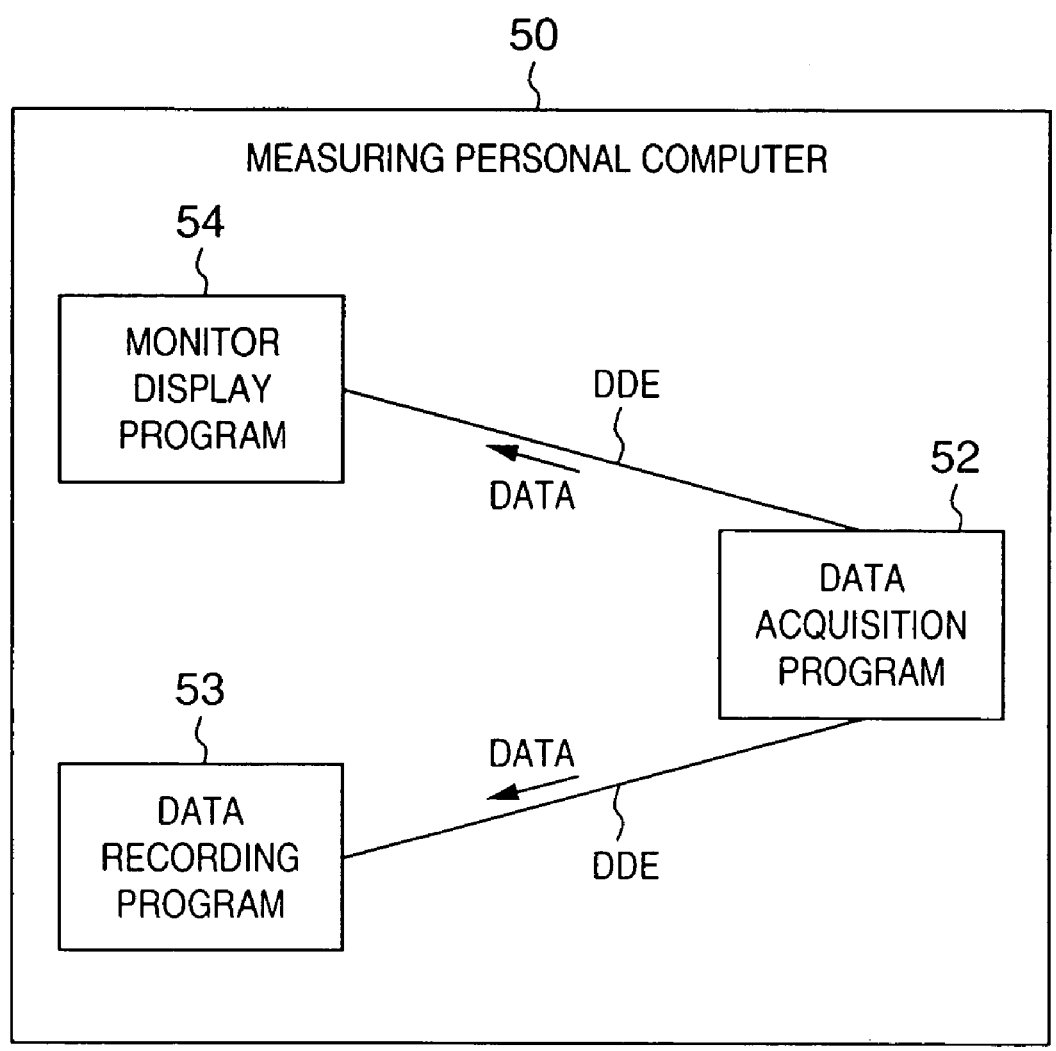
FIG. 2 is a view showing the structure of an integrated measuring program installed in a measuring personal computer shown in FIG. 1.

An integrated measuring program for operating and controlling the measuring system is installed in the measuring personal computer 50. This integrated measuring program includes execution programs shown in FIG. 2. An integrated measuring program means a program group comprised of a plurality of execution programs for executing predetermined processing operations to operate and control the measuring system. In this embodiment, the integrated measuring program comprises a data acquisition program 52 for acquiring data detected by the detection means (more specifically, acquiring data from the data acquisition unit 30), a data recording program 53 for recording acquired numerical data in data files, and a monitor display program 54 for executing predetermined calculation processing on the basis of the acquired data and displaying the calculation result (e.g., power generation characteristic plotted in a graph) on a monitor.

These execution programs run on the basis of the multitask function of, e.g., Windows 95 (trademark of Microsoft) as an operating system running on the personal computer 50 and transmit/receive data by interprocess communication based on DDE (Dynamic Data Exchange).

Interprocess communication means communication for transferring data from an execution program to another execution program. This data transfer can be done between execution programs running on a single personal computer or between execution programs running on different personal computers. The method of interprocess communication between execution programs is not limited to DDE. Instead, OLE (Object Linking and Embedding), UDP (User Datagram Protocol), TCP (Transmission Control Protocol), or data transfer using a file can also be used.

Operation

Figure 3A:
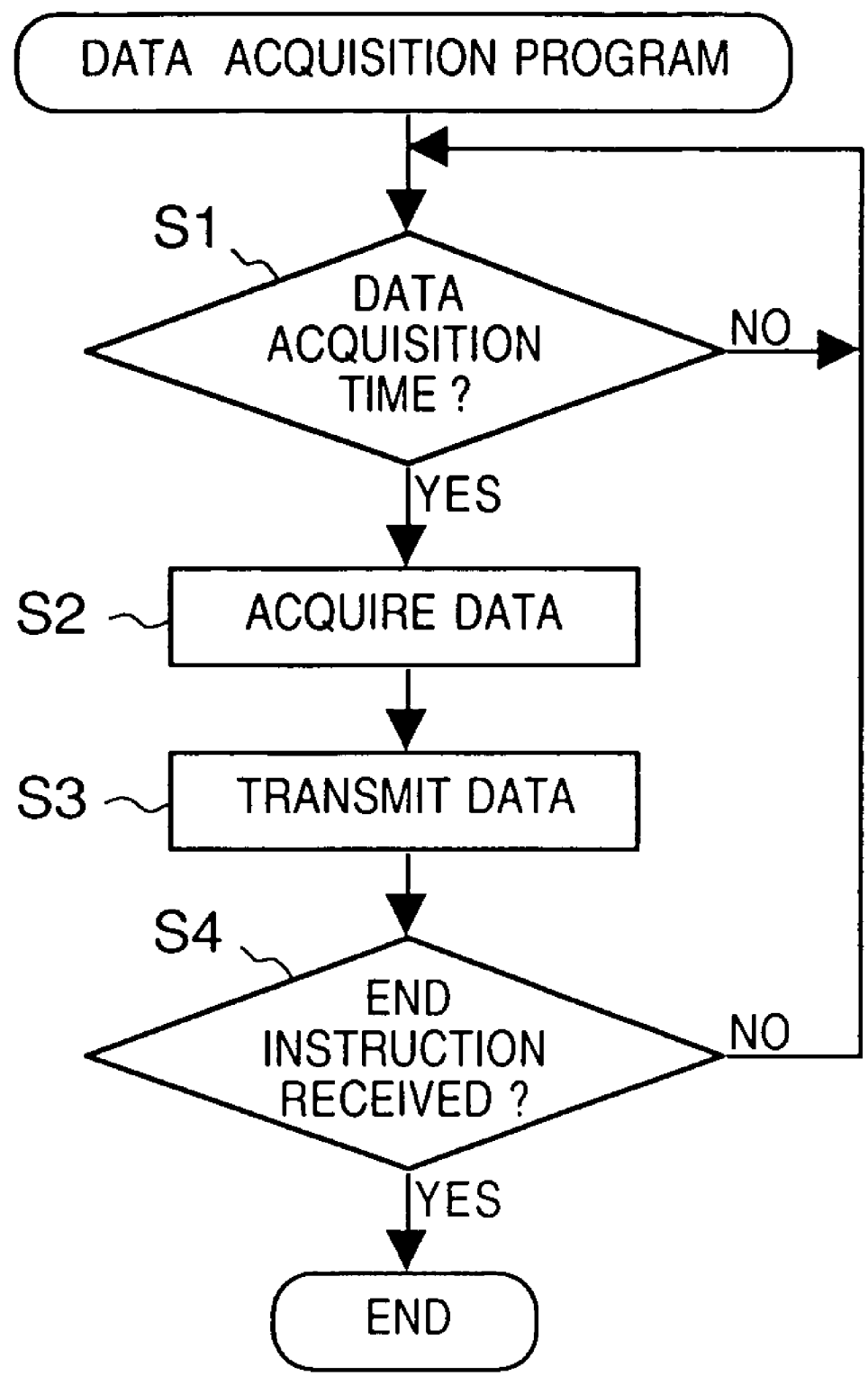
FIGS. 3A to 3C are flow charts for explaining the operation of a data acquisition program shown in FIG. 2.
Figure 3B:
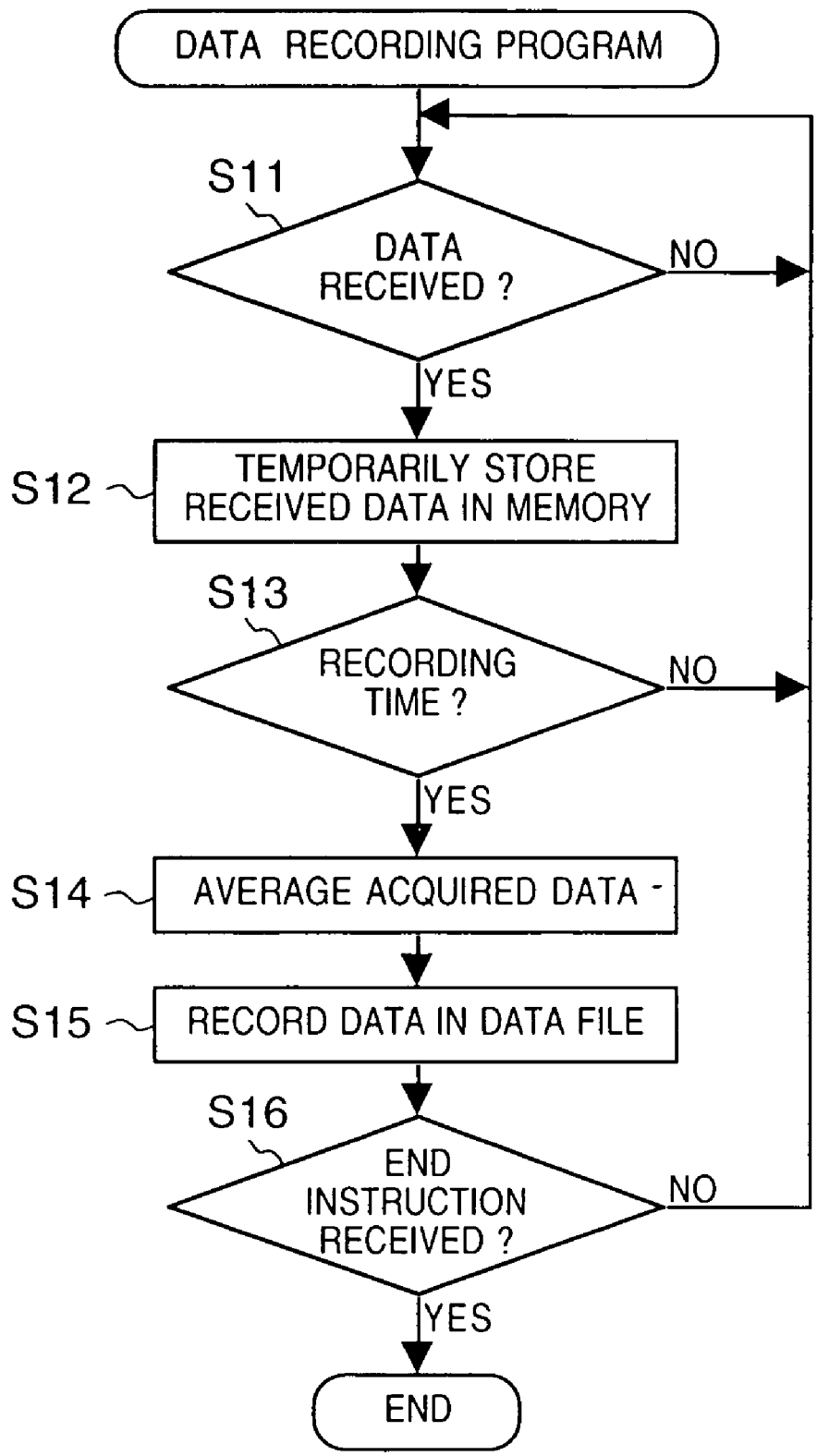
Figure 3C:
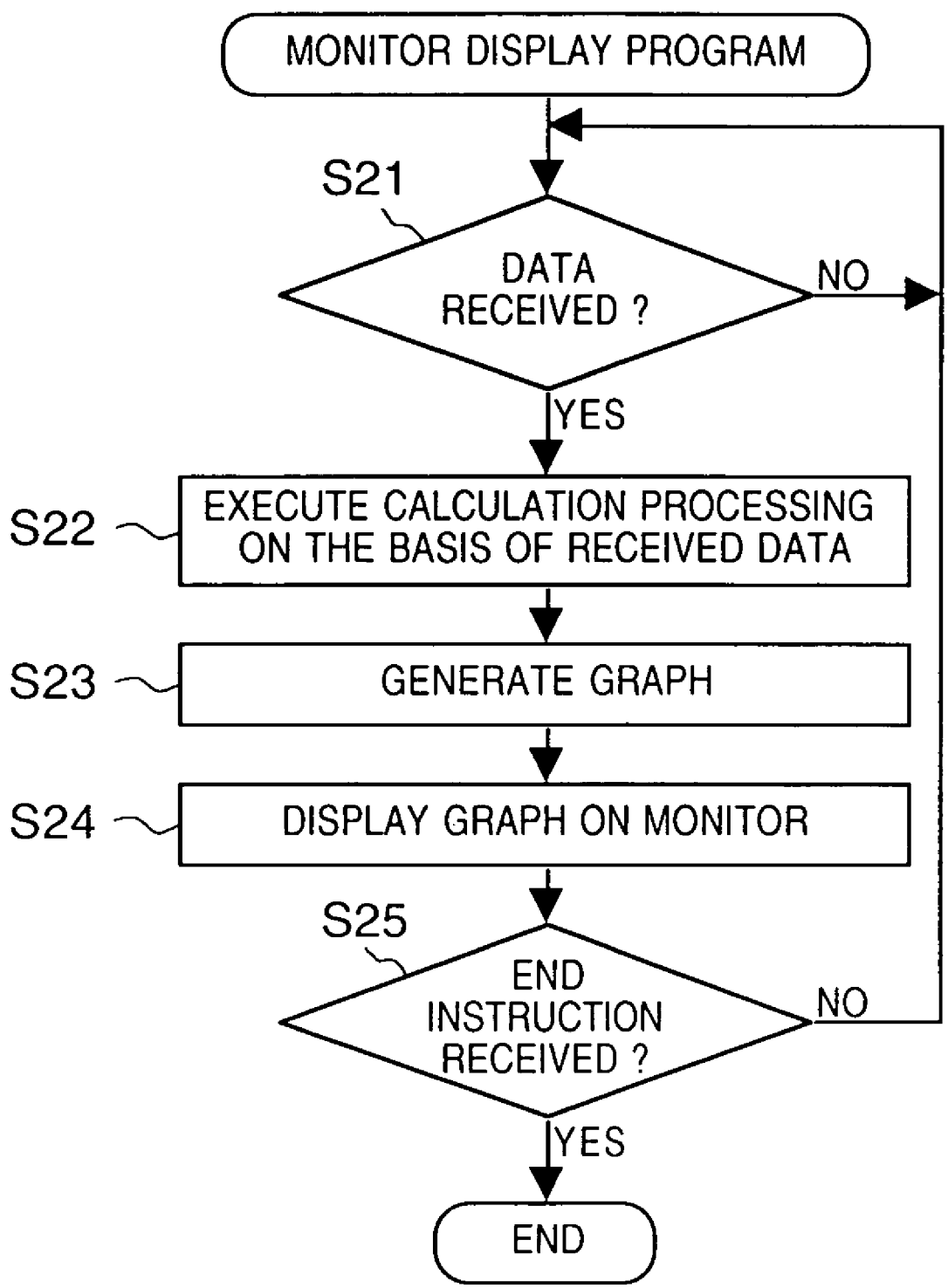

The operation of this embodiment will be described with reference to flow charts. FIG. 3A is a flow chart for explaining the operation of the data acquisition program 52. FIG. 3B is a flow chart for explaining the operation of the data recording program 53. FIG. 3C is a flow chart for explaining the operation of the monitor display program 54.

The detection value from each detector is received by the data acquisition unit 30 and converted into numerical data. The data acquisition program 52 receives the numerical data into the measuring personal computer 50 through the GPIB card 40. The data acquisition interval is set in advance to, e.g., 6 sec in the data acquisition program 52. In step S1, it is determined whether it is the data acquisition time. If YES in step S1, data is acquired in step S2. In step S3, the acquired data is supplied to the data recording program 53 and monitor display program 54 by DDE. Then, in step S4, it is determined whether a program end instruction input by, e.g., the key operation of the measuring personal computer 50 is received. If YES in step S4, the data acquisition program 52 is ended. If NO in step S4, the flow returns to step S1, and the operation in steps S1 to S3 is repeated.

Upon receiving data in step S11, the data recording program 53 temporarily stores the received data in the main memory of the measuring personal computer 50 or the like in step S12. It is determined in step S13 whether it is time to record the data. If NO in step S13, the flow returns to step S11. If YES in step S13, the data temporarily stored in the main memory or the like are averaged in step S14. The number of data to be averaged is determined by the relationship between the data acquisition interval of the data acquisition program 52 and the data recording interval of the data recording program 53. For example, after data in 10 data acquisition cycles are received, these data in 10 cycles are averaged. Alternatively, for example, when data in 10 cycles are received, the data may be averaged. In step S15, the averaged data is recorded in a numerical data file stored in the hard disk of the measuring personal computer 50. After that, it is determined in step S16 whether a program end instruction is received. If YES in step S16, the data recording program 53 is ended. If NO in step S16, the flow returns to step S11, and the operation in steps S11 to S15 is repeated.

Upon receiving data in step S21, the monitor display program 54 executes, in step S22, calculation processing such as graphic processing on the basis of the received data. In step S23, graph information is generated or updated. In step S24, a graph based on the generated or updated graph information is displayed on a monitor (not shown) connected to the measuring personal computer. After that, it is determined in step S25 whether a program end instruction is received. If YES in step S25, the monitor display program 54 is ended. If NO in step S25, the flow returns to step S21, and the operation in steps S21 to S24 is repeated.

As described above, when the measuring system is constructed by three programs classified into three functions, errors in some of these programs do not stop the entire measuring system. For example, when an error occurs in the monitor display program 54, only the monitor display program 54 stops while the data acquisition program 52 and data recording program 53 are kept running. Hence, data are continuously acquired and recorded.

To change the graph window displayed on the monitor, only the monitor display program 54 need be stopped and updated. The entire measuring system need not be stopped. Hence, data are continuously acquired and recorded without any interrupt.

SECOND EMBODIMENT

A measuring apparatus according to the second embodiment of the present invention will be described below. The same reference numerals as in the first embodiment denote the same parts in the second embodiment, and a detailed description thereof will be omitted.

Figure 4:
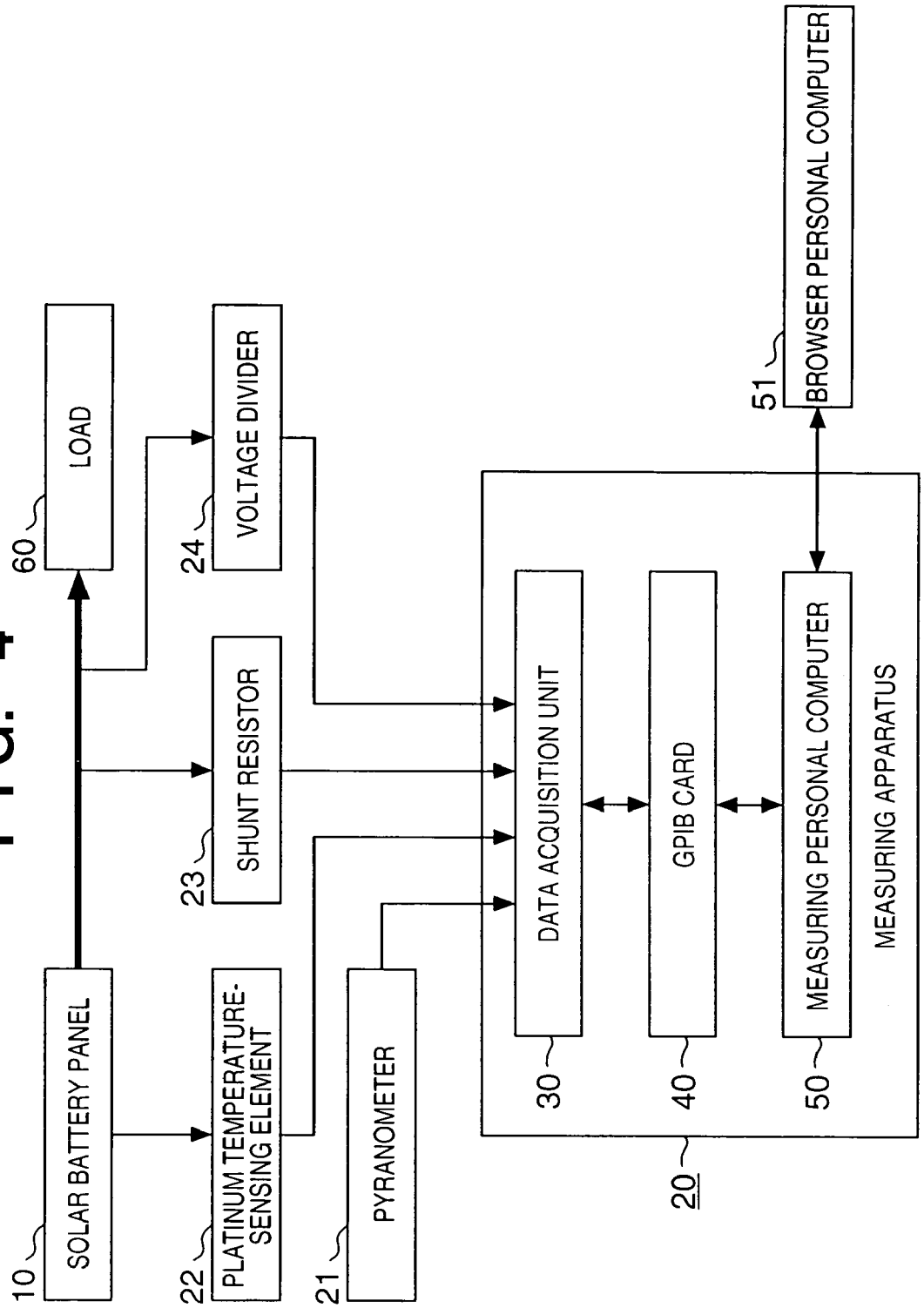
FIG. 4 is a block diagram showing the arrangement of a measuring system according to the second embodiment.

FIG. 4 is a block diagram showing the arrangement of a measuring system including a measuring apparatus 20 of the second embodiment.

As shown in FIG. 4, the measuring system of the second embodiment has two personal computers: a measuring personal computer 50 for acquiring data, and a browser personal computer 51 for displaying the acquired data. The measuring personal computer 50 and browser personal computer 51 are connected through a network such as a LAN. If the measuring personal computer 50 is at a remote site, the two personal computers can be connected through a communication line such as a dedicated line or telephone line.

Figure 5:
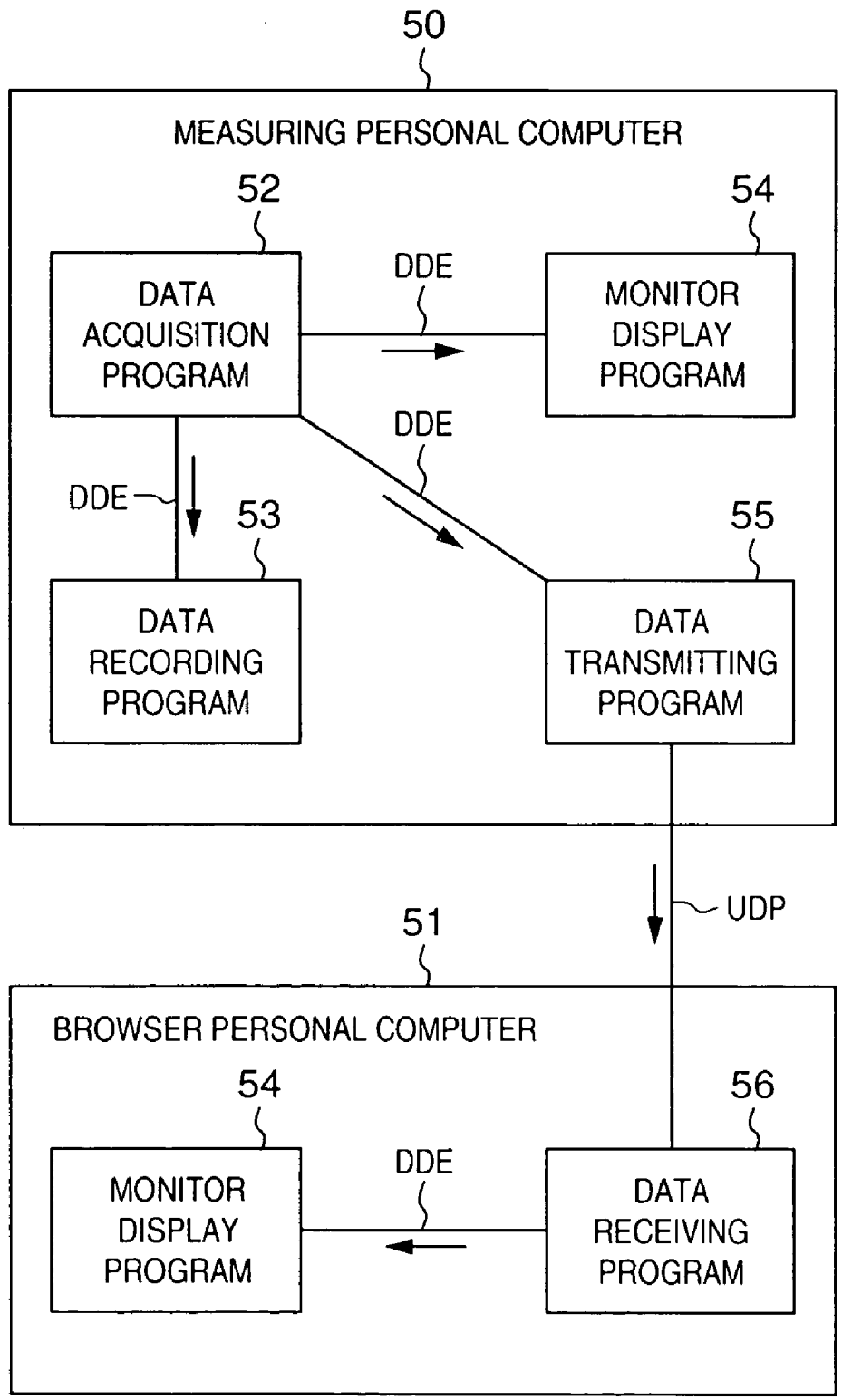
FIG. 5 is a view showing the structure of an integrated measuring program installed in a measuring personal computer and browser personal computer shown in FIG. 4.

Integrated measuring programs including execution programs shown in FIG. 5 are installed in the personal computers. Referring to FIG. 5, a data transmitting program 55 is a communication program for transmitting data to another personal computer (browser personal computer 51 in FIG. 5). A data receiving program 56 is a communication program for receiving data transmitted from another personal computer (measuring personal computer 50 in FIG. 5). Interprocess communication between the measuring personal computer 50 and the browser personal computer 51 uses UDP. However, another interprocess communication scheme as described above can be used.

The operation of this embodiment will be described next with reference to flow charts. The operations of a data acquisition program 52, data recording program 53, and monitor display program 54 in the measuring personal computer 50, and the operation of the monitor display program 54 in the browser personal computer 51 are the same as those shown in FIGS. 3A to 3C, and a detailed description thereof will be omitted.

Figure 6B:
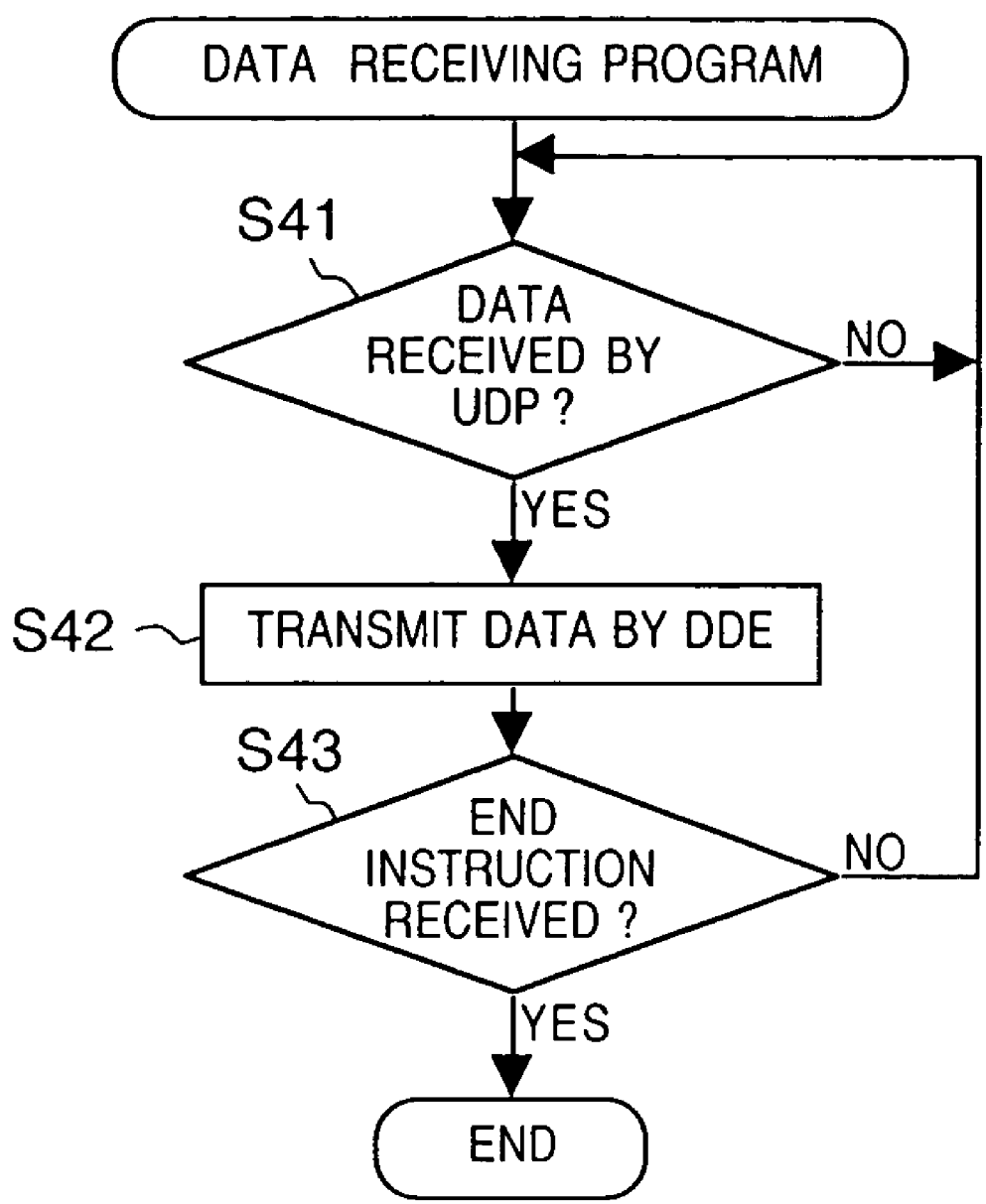
FIG. 6B is a flow chart for explaining the operation of a data receiving program shown in FIG. 5.

FIG. 6A is a flow chart for explaining the operation of the data transmitting program 55. FIG. 6B is a flow chart for explaining the operation of the data receiving program 56.

Data acquired by the data acquisition program 52 is supplied to the data transmitting program 55 by DDE. Upon receiving the data in step S31, the data transmitting program 55 transmits the received data to the browser personal computer 51 by UDP in step S32. After that, it is determined in step S33 whether a program end instruction is received. If YES in step S33, the data transmitting program 55 is ended. If NO in step S33, the flow returns to step S31, and the operation in steps S31 and S32 is repeated.

On the other hand, upon receiving the data in step S41, the data receiving program 56 supplies the received data to the monitor display program 54 by DDE in step S42. After that, it is determined in step S43 whether a program end instruction is received. If YES in step S43, the data receiving program 56 is ended. If NO in step S43, the flow returns to step S41, and the operation in steps S41 and S42 is repeated.

As described above, when programs are generated in units of functions, a measuring system using a plurality of personal computers can be built only by generating a program for transmitting data and a program for receiving data. That is, when the measuring system is constructed by a plurality of programs classified into functions, a program corresponding to a desired measuring system only need be generated, added, or changed. Especially, when programs classified them into the data acquisition function, data recording function, data display function, and data communication function are generated (constructed), the measuring system can be easily extended or updated independently of the number of personal computers or data display means connected to a network to form the system, resulting in great convenience.

Important functions of the basic arrangement of the measuring system are the above-described data acquisition function, data recording function, data display function, and data communication function. However, the integrated measuring program can include any other function. The measuring system can be freely constructed using programs of various functions, including a program for transferring data by radio, a program for displaying data on a display unit such as an LED or LCD, and a program for plotting acquired data in a graph and displaying it on a web site.

THIRD EMBODIMENT

A measuring apparatus according to the third embodiment of the present invention will be described below. The same reference numerals as in the first embodiment denote the same parts in the third embodiment, and a detailed description thereof will be omitted.

Figure 7:
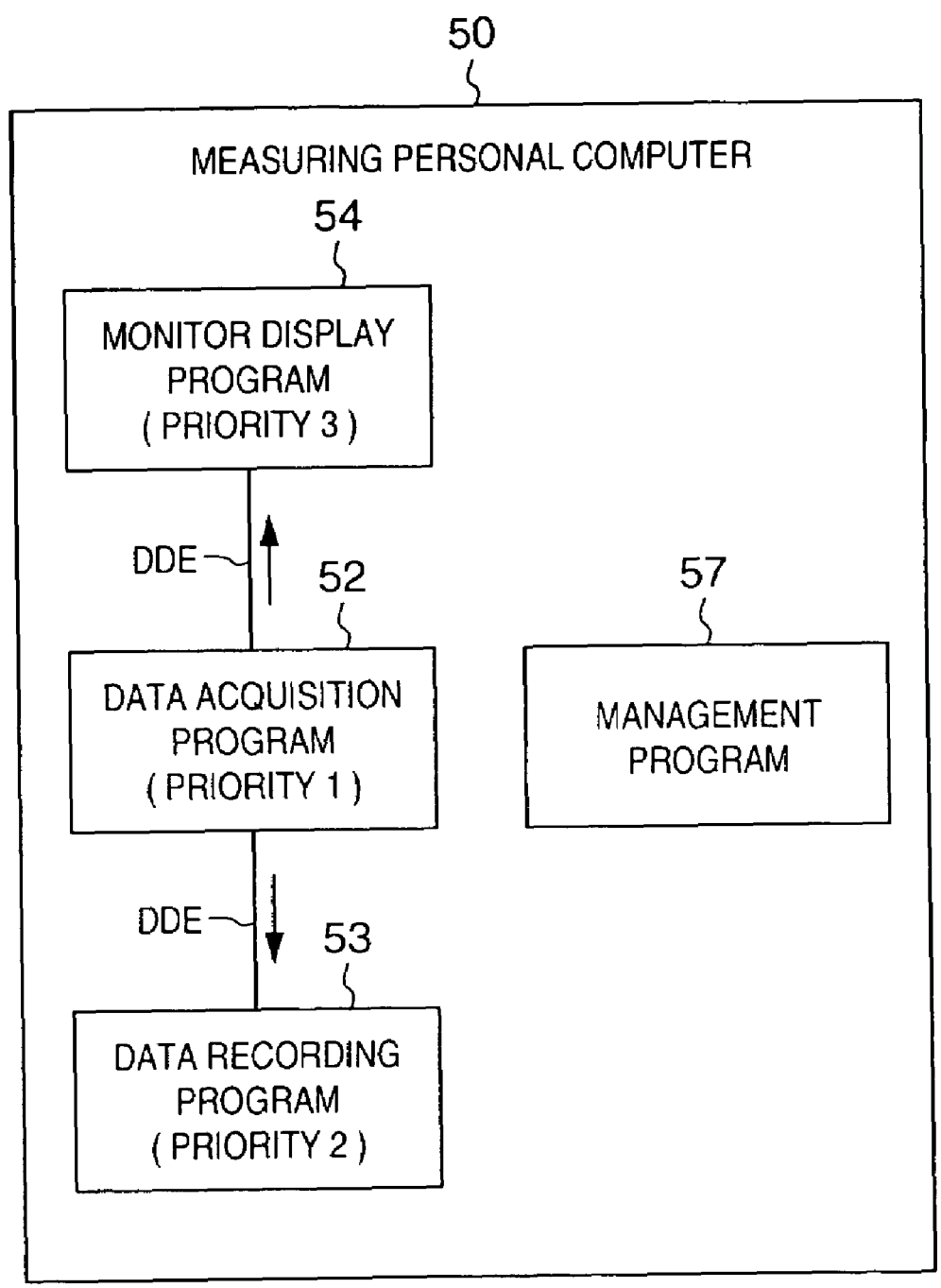
FIG. 7 is a view showing the structure of an integrated measuring program according to the third embodiment.

FIG. 7 is a view showing the structure of an integrated measuring program according to the third embodiment.

As shown in FIG. 7, when priorities are given to the execution programs forming the integrated measuring program, and a management program 57 for managing the execution programs is added, the measuring system can be more stably operated. The priorities can be determined in units of measuring personal computers 50 in accordance with the degrees of importance of the execution programs. An execution program having the highest degree of importance has the highest priority. For example, when the integrated measuring program has a data acquisition program 52, data recording program 53, and monitor display program 54, the data acquisition program 52 should have the highest priority because data to be recorded or displayed is not acquired unless the data acquisition program 52 runs.

The management program 57 manages activation and stop of each execution program in the measuring personal computer 50. When an error occurs in a certain execution program, the management program 57 activates or stops each execution program on the basis of the priority of the execution program. That is, the third embodiment has almost the same arrangement as that of the first or second embodiment except that the management program 57 for giving priorities to the execution programs in the measuring personal computer 50 and controlling activation and stop of each execution program is provided.

In the measuring system, the data acquisition program 52 for acquiring data and supplying the acquired data to another execution program is important. Hence, in many cases, the data acquisition program 52 has the highest priority and therefore can have the function of the management program 57. However, since a characteristic feature of this embodiment is that programs are prepared in units of functions, the data acquisition program 52 and management program 57 are prepared as separate programs.

FIG. 8 is a flow chart showing the operation of the management program 57, i.e., processing executed by the activated management program 57.

In step S51, each execution program is activated in accordance with its priority. In this embodiment, the data acquisition program 52, data recording program 53, and monitor display program 54 are activated in this order. After that, the execution programs run in accordance with the flow charts shown in FIGS. 3A to 3C.

In step S52, the management program 57 checks the operation of each execution program. In step S53, it is checked whether an error has occurred in a running execution program. If NO in step S53, the operation in steps S52 and S53 is repeated.

If YES in step S53, the priority of the execution program having the error is obtained in step S54. In step S55, the execution program having the error and execution programs having lower priorities than the execution program having the error are stopped. In step S56, the stopped execution programs are reactivated in the priority order. Then, the flow returns to step S52.

For example, when an error has occurred in the data acquisition program 52, the management program 57 stops all execution programs because the data acquisition program 52 has the highest priority. Then, the data acquisition program 52, data recording program 53, and monitor display program 54 are reactivated in this order.

Thus, the measuring system can be more stably operated by giving priorities to the execution programs and controlling activation and stop of each execution program. For example, when the data acquisition program 52 stops, and no data is supplied, the data recording program 53 and monitor display program 54 can be prevented from keeping running to record or display incorrect data.

As has been described above, according to the above embodiments, a measuring system is constructed by a plurality of execution programs divided in units of functions. This reduces the size of each execution program and facilitates generation or debug of each execution program. In addition, even when errors occur in some execution programs, all functions of the measuring system stop with least possibility.

When an execution program for acquiring data and that for displaying acquired data are prepared as separate programs, the display means can be changed without changing the entire execution program but by changing only the execution program for display.

When an execution program for data communication is prepared as a separate program, the measuring system can be formed from a plurality of information processing apparatuses, so the entire measuring system can be freely extended or modified. Especially, when the execution program is divided in correspondence with the data acquisition function, data recording function, data display function, and data communication function, the system can be easily extended and modified independently of the number of information processing terminals or display means connected to the network, resulting in great convenience.

Furthermore, when a priority is given to each execution program, and the operation of each execution program is controlled by the management program, the entire measuring system can be stably operated.

As many apparently widely different embodiments of the present invention can be made without departing from the spirit and scope thereof, it is to be understood that the invention is not limited to the specific embodiments thereof except as defined in the appended claims.

What is claimed is:

1. An information processing apparatus for accumulating data of a measurement target, said apparatus comprising:

an acquisition section, arranged to acquire the data of the measurement target by independently executing a computer program for data acquisition;

a display section, arranged to generate information to be displayed by independently executing a computer program for display information generation on the basis of the acquired data which is supplied to the display section by the acquiring section by interprocess communication;

a recording section, arranged to record on a recording medium the data acquired by the acquiring section, where the data to be recorded is supplied to the recording section by the acquiring section by interprocess communication, the data being recorded on the recording medium by independently executing a computer program for data recording; and a management section, arranged to control operations of said acquisition, display, and recording sections in accordance with priorities of said acquisition, display, and recording sections, by independently executing a computer program for operation control, wherein all of the computer programs of said acquisition, display, recording, and management sections are provided as an integrated computer program which integrates the independent computer programs, and the computer programs are executed independent of one another under a multitasking function of an operating system, and wherein the priority of the data acquisition program is higher than that of both the recording program and the display information generation program, and wherein, when an error occurs in any one of the data acquisition program, the recording program, and the display information generation program, the management section suspends execution of the program in which the error occurs, and programs having a priority lower than that of the program in which the error occurs.

* * * * *